(12) United States Patent
Buettgen et al.

(10) Patent No.: US 10,578,739 B2
(45) Date of Patent: Mar. 3, 2020

(54) OPTOELECTRONIC MODULES FOR THE ACQUISITION OF SPECTRAL AND DISTANCE DATA

(71) Applicant: AMS SENSORS SINGAPORE PTE. LTD., Singapore (SG)

(72) Inventors: Bernhard Buettgen, Adliswil (CH); Gözen Köklü, Zurich (CH); Daniel Furrer, Uetikon am See (CH); Stephan Beer, Schaffhausen (CH); Miguel Bruno Vaello Paños, Zurich (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 37 days.

(21) Appl. No.: 15/764,358

(22) PCT Filed: Sep. 26, 2016

(86) PCT No.: PCT/SG2016/050473
§ 371 (c)(1),
(2) Date: Mar. 29, 2018

(87) PCT Pub. No.: WO2017/058109
PCT Pub. Date: Apr. 6, 2017

(65) Prior Publication Data
US 2018/0284273 A1 Oct. 4, 2018

Related U.S. Application Data

(60) Provisional application No. 62/235,935, filed on Oct. 1, 2015.

(51) Int. Cl.
*G01S 17/08* (2006.01)
*G01B 11/00* (2006.01)
(Continued)

(52) U.S. Cl.
CPC .............. *G01S 17/08* (2013.01); *G01B 11/00* (2013.01); *G01C 3/08* (2013.01); *G01J 3/0208* (2013.01);
(Continued)

(58) Field of Classification Search
CPC .. H01L 27/14621; G01S 17/08; G01J 3/0208; G01J 3/0229; G01J 3/36; G01J 1/0204;
(Continued)

(56) References Cited

U.S. PATENT DOCUMENTS 9,117,712 B1 8/2015 Oggier et al.
9,958,535 B2 * 5/2018 Send ....................... G01S 17/32
(Continued)

FOREIGN PATENT DOCUMENTS

WO 2013/104718 A2 7/2013

OTHER PUBLICATIONS

ISA/AU, International Search Report for PCT/SG2016/050473 (dated Dec. 22, 2016).

*Primary Examiner* — David P Porta
*Assistant Examiner* — Fani Boosalis
(74) *Attorney, Agent, or Firm* — Michael Best & Friedrich LLP

(57) ABSTRACT

An optoelectronic module operable to acquire distance data and spectral data includes an array of demodulation pixels and an array of spectral filters. The demodulation pixels can possess an intrinsic wavelength-dependent sensitivity, wherein the intrinsic wavelength-dependent sensitivity can be offset by an intensity balancing micro-lens array in some cases. In some cases, the intrinsic wavelength-dependent sensitivity can be offset by a combined filter array, while in other cases the intrinsic wavelength-dependent sensitivity can be offset by an intensity balancing filter array. Still in
(Continued)

other cases, the demodulation pixels can be operable in such as to offset the intrinsic wavelength-dependent sensitivity.

18 Claims, 7 Drawing Sheets

(51) Int. Cl.
G01J 3/28 (2006.01)
G01J 3/36 (2006.01)
H01L 27/148 (2006.01)
G01J 3/02 (2006.01)
H01L 27/146 (2006.01)
G01C 3/08 (2006.01)
G06T 7/514 (2017.01)
G01S 17/89 (2020.01)
H04N 5/33 (2006.01)

(52) U.S. Cl.
CPC ............ *G01J 3/0213* (2013.01); *G01J 3/0216* (2013.01); *G01J 3/0229* (2013.01); *G01J 3/2803* (2013.01); *G01J 3/2823* (2013.01); *G01J 3/36* (2013.01); *G01S 17/89* (2013.01); *G06T 7/514* (2017.01); *H01L 27/14621* (2013.01); *H01L 27/14627* (2013.01); *H01L 27/14825* (2013.01); *H04N 5/332* (2013.01); *G01J 2003/2806* (2013.01); *G06T 2207/10024* (2013.01)

(58) Field of Classification Search
CPC ............ G01J 2003/2806; G01J 3/0213; G01J 3/0216; G06T 7/514
See application file for complete search history.

(56) References Cited

U.S. PATENT DOCUMENTS 10,012,532 B2 * 7/2018 Send .................. G01S 17/46
2013/0140433 A1 6/2013 Oggier et al.

* cited by examiner

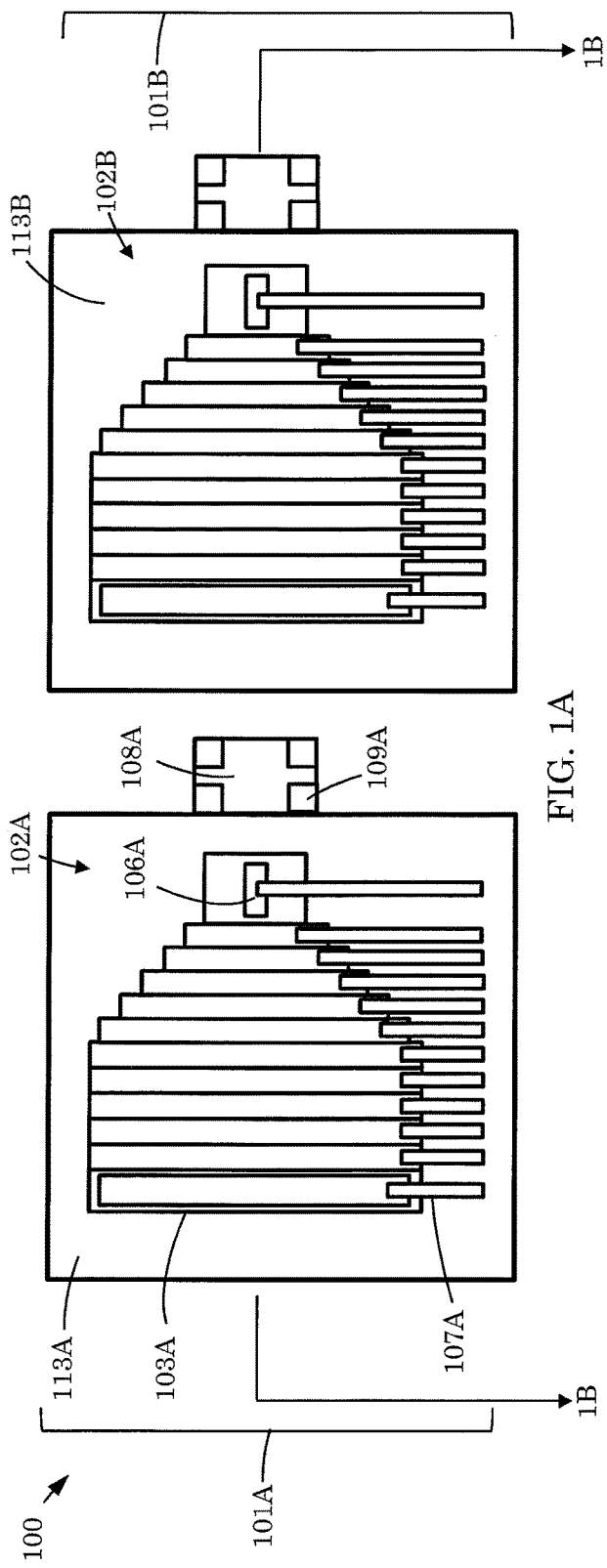
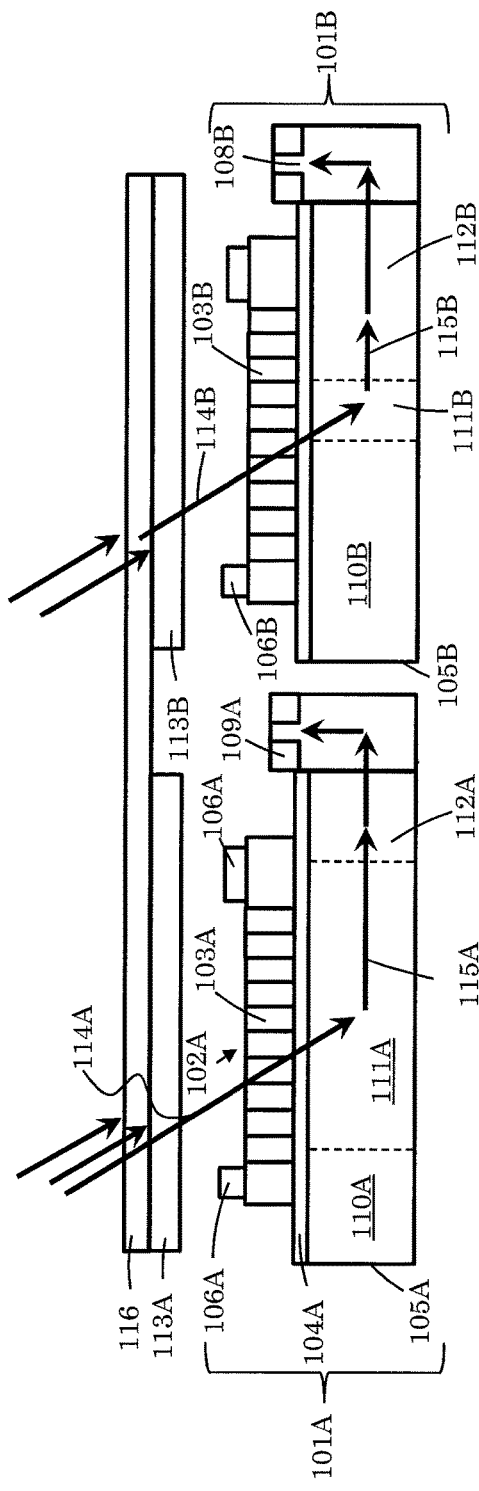
FIG. 1A
FIG. 1B

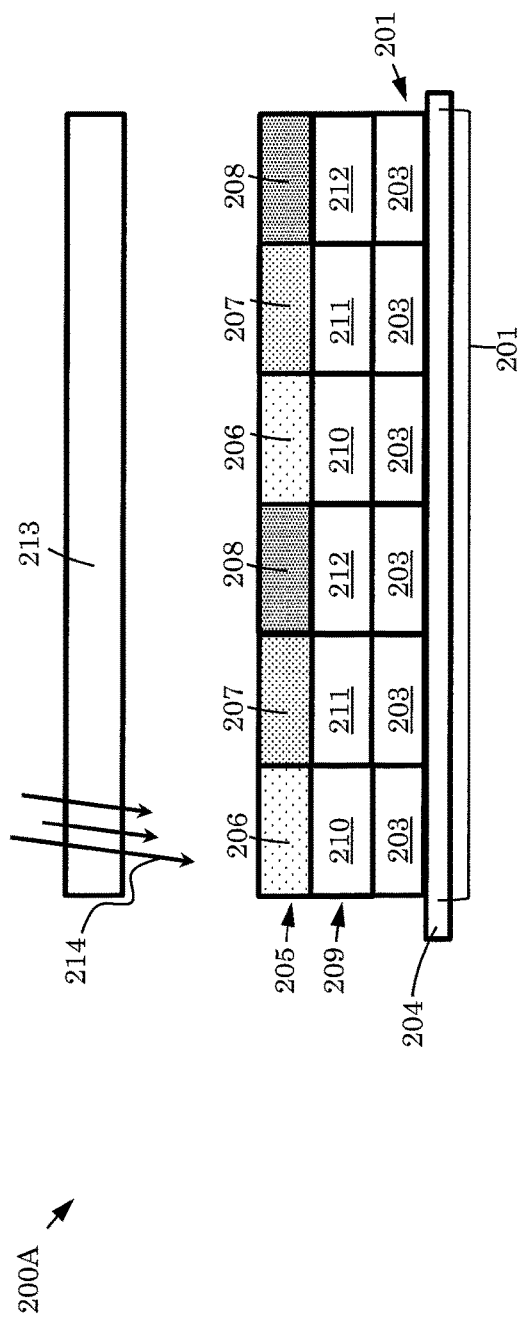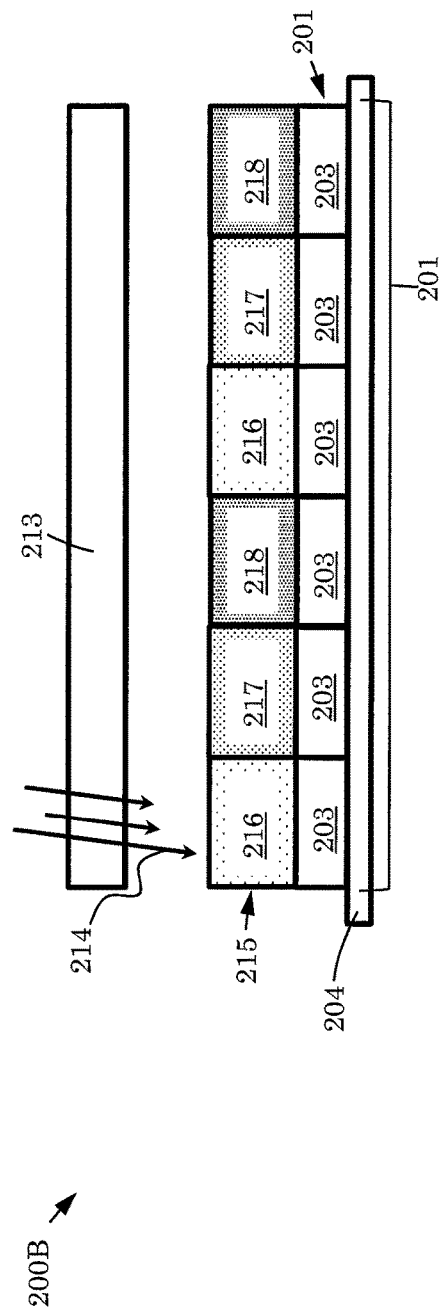

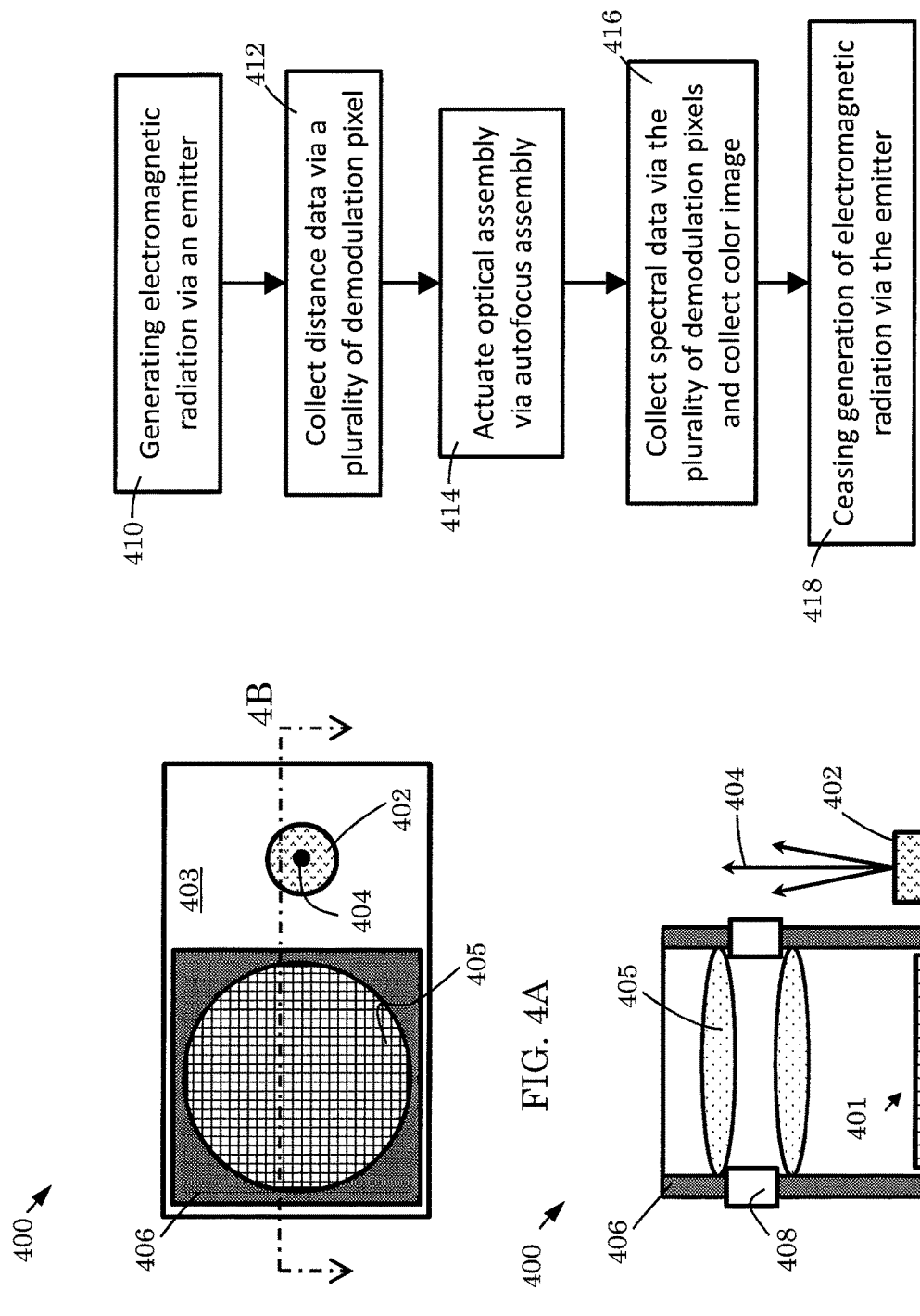

OPTOELECTRONIC MODULES FOR THE ACQUISITION OF SPECTRAL AND DISTANCE DATA

TECHNICAL FIELD

The present disclosure relates to optoelectronic modules including modulation pixels that can acquire both spectral and distance data.

BACKGROUND

Demodulation pixels are well known in the field of contactless distance measurement, proximity detection, and multi-dimensional imaging. Demodulation pixels can be employed in time-of-flight techniques. In brief, in some cases, time-of-flight distance measurements, proximity detection and/or multi-dimensional imaging require a modulated light source and at least one demodulation pixel. Modulated light incident on a multi-dimensional object or scene is reflected and captured by a demodulation pixel or demodulation pixel array. The captured light is converted into a signal, wherein amplitude and distance information/data is extracted from the demodulated signal (e.g., the phase shift of the captured light).

Distance measurements, proximity detection, and multi-dimensional imaging data are sometimes combined with spectral data of an object or scene. However, as demodulation pixels are dedicated to the acquisition of distance data they must be combined with separate pixels or a pixel array with corresponding spectral filters in order to acquire both distance data and spectral data with the same optoelectronic device. Accordingly, additional lateral space must be afforded to these separate pixels. In order to reduce the footprint of optoelectronic devices/modules capable of acquiring both distance data and spectral data a challenge exits to combine both of these functions within the same pixel.

Moreover, sensors (e.g. pixels arrays) may have physical defects and limitations. Defects are typical and often due to a defective or impure material, for example. A pixel with a defect may not respond to incident electromagnetic radiation in the same way or to the same degree as a neighboring pixel. For example, a defective pixel may appear saturated regardless of the magnitude of electromagnetic radiation incident on the defective pixel. Further, a pixel may be too dark or too bright by a particular fraction as compared to a neighboring pixel. Consequently, in-situ correction of the defective pixel (at the pixel level) is desirable.

In addition to the physical defects, a pixel's dynamic range is inherently limited. For example, if a pixel is exposed to too much electromagnetic radiation during spectral or distance data acquisition, the pixel may become saturated. Accordingly, the signal from the pixel may not be used; therefore, prevention of saturation (or saturation mitigation) at the sensor-level is also desirable.

SUMMARY

The present disclosure describes optoelectronic modules operable to capture both distance data and spectral data via a demodulation pixel or an array of demodulation pixels. The present disclosure also describes pixel-level correction of defective pixels. The present disclosure further describes pixel-level saturation prevention and/or saturation mitigation.

In one aspect, for example, an optoelectronic module is operable to collect distance data and spectral data via the same demodulation pixel array. In such an implementation, the optoelectronic module includes a plurality of demodulation pixels and a plurality of respective spectral filters. Each spectral filter is disposed to transmit a particular wavelength or range of wavelengths of electromagnetic radiation onto a corresponding demodulation pixel among the demodulation pixels. Such an implementation can proffer an advantage in some instances because spectral and distance data can be acquired by the same pixel array.

In another aspect, an emitter is operable to generate modulated electromagnetic radiation having a particular modulation frequency and a particular emission wavelength or range of emission wavelengths.

According to another aspect, an optical assembly including a plurality of optical elements is mounted within an optical element housing, the optical assembly has a corresponding focal-length, and the optical assembly is aligned with a plurality of demodulation pixels and separated from the plurality of demodulation pixels by the focal-length.

In another aspect, an auxiliary spectral filter is disposed to transmit a particular emission wavelength or range of emission wavelengths of electromagnetic radiation generated by an emitter. Such an implementation can proffer an advantage in some instances because spectral and distance data can be acquired by the same pixel array.

In another aspect, an emitter is operable to generate modulated electromagnetic radiation having a particular modulation frequency and a particular emission wavelength or range of emission wavelengths, wherein the particular emission wavelength or range of emission wavelengths of electromagnetic radiation generated by the emitter correspond to the infrared region of the electromagnetic spectrum. Such an implementation can proffer an advantage in some instances because infrared wavelengths are not visible to humans.

According to another aspect, demodulation pixels are operable to modify their respective sensitivities to electromagnetic radiation according to a particular wavelength or range of wavelengths of electromagnetic radiation transmitted by their respective spectral filters. Such an implementation can proffer an advantage in some instances, for example, in situ correction of defective pixels is possible. Further, in some instance, prevention or mitigation of pixel saturation is possible.

In another aspect, demodulation pixels are operable to modify their respective sensitivities to electromagnetic radiation according to a particular wavelength or range of wavelengths of electromagnetic radiation transmitted by their respective spectral filters such that an intensity of a signal generated in a respective demodulation pixel is not saturated.

Another aspect describes drift-field demodulation pixels operable to modify their respective sensitivity to electromagnetic radiation by modification of their respective drift-fields within each respective drift-field demodulation pixel. Such an implementation can proffer an advantage in some instances, for example, as in situ correction of defective pixels is possible. Further, in some instance, prevention or mitigation of pixel saturation is possible.

Another aspect describes a plurality of respective spectral filters, wherein the spectral filters includes a first spectral filter, a second spectral filter, and a third spectral filter, wherein the first spectral filter corresponds to a red filter, the second spectral filter corresponds to a green filter, and the third spectral filter corresponds to a blue filter. Such an implementation can proffer an advantage in some instances, for example, when a demodulation pixel is particularly sensitive to red light; accordingly, prevention or mitigation of pixel saturation, of pixels associated with red light, is possible.

In another aspect, a first drift-field demodulation pixel is associated with a first filter having a first sensitivity, a first drift-field demodulation pixel is associated with a second filter have a second sensitivity, and a third drift-field demodulation pixel is associated with a third filter having a third sensitivity.

According to another aspect, a third sensitivity is greater than a second sensitivity, and the second sensitivity is greater than a first sensitivity.

In another aspect, an optoelectronic module has an intensity balancing filter array, the intensity balancing filter array including a plurality of intensity balancing regions with respective different wavelength-independent transmissivities to electromagnetic radiation, each respective intensity balancing region being associated with a respective spectral filter.

In yet another aspect, an optoelectronic module has an intensity balancing microlens array, the intensity balancing microlens array including a plurality of intensity balancing microlenses with respective different wavelength-independent transmissivities to electromagnetic radiation, each respective intensity balancing region being associated with a respective spectral filter.

In another aspect, an optoelectronic device is operable to collect distance data and spectral data via the same demodulation pixel array, the optoelectronic module includes a plurality of demodulation pixels and a combined filter array. Such an implementation further includes an emitter operable to generate modulated electromagnetic radiation having a particular modulation frequency and a particular emission wavelength or range of emission wavelengths; and an optical assembly including a plurality of optical elements mounted within an optical element housing, the optical assembly having a focal-length wherein the optical assembly is aligned with the plurality of demodulation pixels and separated from the plurality of demodulation pixels by the focal-length.

According to another aspect, an optoelectronic device has an autofocus assembly.

In yet another aspect, an emitter is operable to generate a plurality of wavelengths of demodulated electromagnetic radiation.

In another aspect, an emitter is operable to generate a plurality of wavelengths of demodulated electromagnetic radiation that corresponds to white light.

According to another aspect, an emitter is operable to generate a plurality of wavelengths of demodulated electromagnetic radiation that corresponds to white light and further includes infrared.

Another aspect describes a method for collecting a color image of a three-dimensional scene with an optoelectronic device operable to collect distance data and spectral data via the same demodulation pixel array. The method includes generating modulated electromagnetic radiation via an emitter and directing the modulated electromagnetic radiation onto a three-dimensional scene. The method further includes focusing modulated electromagnetic radiation reflected from the three-dimensional scene onto a plurality of three-dimensional pixels and a combined filter array. The method further includes collecting distance data via the plurality of demodulation pixels and the combined filter array. The method further includes actuating an optical assembly via an autofocus assembly based on the distance data collected via the plurality of demodulation pixels and the combined filter array such that the three-dimensional scene is focused on the plurality of demodulation pixels. The method further includes collecting spectral data via the plurality of demodulation pixels and the combined filter array, and generating a color image via the collected spectral data. The method further includes ceasing generation of modulated electromagnetic radiation from the emitter.

In another aspect, the method includes generating modulated electromagnetic radiation that corresponds to white light.

Another aspect describes a method for collecting a color image of a three-dimensional scene with an optoelectronic device operable to collect distance data and spectral data via the same demodulation pixel array. The method includes generating first modulated electromagnetic radiation via an emitter and directing the first modulated electromagnetic radiation onto a three-dimensional scene. The method further includes focusing first modulated electromagnetic radiation reflected from the three-dimensional scene onto a plurality of three-dimensional pixels and a combined filter array. The method further includes collecting distance data via the plurality of demodulation pixels and the combined filter array. The method further includes actuating an optical assembly via an autofocus assembly based on the distance data collected via the plurality of demodulation pixels and the combined filter array such that the three-dimensional scene is focused on the plurality of demodulation pixels. The method further includes collecting first spectral data via the plurality of demodulation pixels and the combined filter array. The method further includes generating second modulated electromagnetic radiation via the emitter, the second modulated electromagnetic radiation being adjusted based on the first spectral data, directing the second modulated electromagnetic radiation onto the three-dimensional scene. The method further includes focusing second modulated electromagnetic radiation reflected from the three-dimensional scene onto the plurality of three-dimensional pixels and the combined filter array. The method further includes collecting second spectral data via the plurality of demodulation pixels and the combined filter array, and generating a color image via the collected second spectral data. The method further includes ceasing generation of second modulated electromagnetic radiation from the emitter.

Other aspects, features and advantages will be readily apparent from the following detailed description, the accompanying drawings, and the claims.

BRIEF DESCRIPTION OF THE DRAWINGS

FIG. 1A depicts an example of an optoelectronic module configured to acquire both distance data and spectral data in a plan-view.

FIG. 1B depicts a side-view of the optoelectronic module depicted in FIG. 1A.

FIG. 2A depicts another example of an optoelectronic module configured to acquire both distance data and spectral data via an intensity balancing filter array.

FIG. 2B depicts another example of an optoelectronic module configured to acquire both distance data and spectral data via a combined intensity balancing filter array and color filter array.

FIG. 4A depicts an example of an optoelectronic device into which any of the optoelectronic modules above can be incorporated.

FIG. 4B depicts a cross-sectional view of the example optoelectronic device depicted in FIG. 4A.

FIG. 4C depicts an example method for collecting a color image via the example optoelectronic device depicted in FIG. 4A and FIG. 4B.

DETAILED DESCRIPTION

Figure 1C:
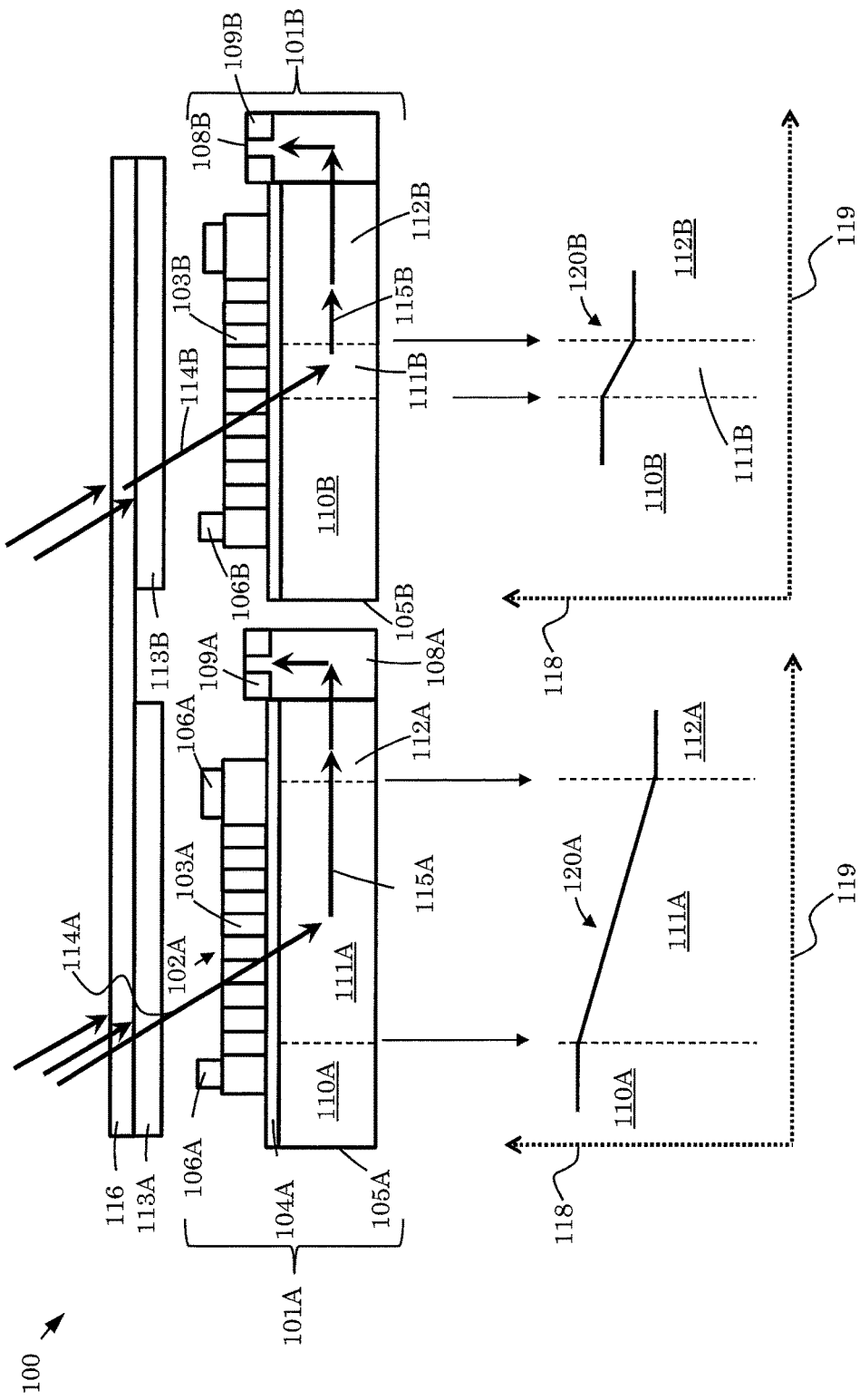
FIG. 1C depicts a side-view of the optoelectronic module depicted in FIG. 1A with an illustration of potentials that are optimized for spectral data acquisition.

As shown in FIGS. 1A and 1B, an optoelectronic module 100 includes demodulation pixels 101A, 101B (e.g., drift-field demodulation pixels), spectral filters 113A, 113B, and an auxiliary spectral filter 116. The demodulation pixels 101A, 101B include respective photosensitive detection regions 102A, 102B. The photosensitive detection regions 102A, 102B respectively include the following: a plurality of gates 103A, 103B, insulator layers 104A, 104B, semiconductor substrates 105A, 105B, a plurality of contact nodes 106A, 106B, a plurality of corresponding electrodes 107A, 107B, respectively. The drift-field, demodulation pixels 101A, 101B further include respective demodulation regions 108A, 108B. The demodulation regions 108A, 108B include a plurality of output nodes 109A, 109B. Potentials (e.g., voltages) can be applied to the plurality of contact nodes 106A, 106B via electrodes 107A, 107B. The applied potentials can generate a plurality of potential regions within the semiconductor substrate 105; that is, a plurality of respective drift-field regions as described further in FIG. 1C below.

FIG. 1C depicts a side-view of the example depicted in FIG. 1A and FIG. 1B with an illustration of potentials 118 within the semiconductor substrates 104A, 104B of each respective drift-field, demodulation pixel 101A, 101B. In this example, the potentials are optimized for spectral data acquisition. Different potentials can be applied to each respective drift-field, demodulation pixel 101A, 101B in the drift-field, demodulation pixel array 100 via the series of contact nodes 106A, 106B and corresponding electrodes 107A, 107B, respectively. The applied potentials can generate regions of differing potentials within the semiconductor substrates 105A, 105B of each respective drift-field, demodulation pixel 101A, 101B. For example, a high potential region 110A, a drift-field region 111A, and a low potential region 112A are generated in the drift-field demodulation pixel 101A depicted on the left-hand side of FIG. 1A with the application of a particular potential profile. Likewise, with the application of a different potential profile, a high potential region 110B, a drift-field region 111B, and a low potential region 112B are generated in the drift-field, demodulation pixel 101B, depicted on the right-hand side of FIG. 1A. In this example, the lateral extent of the drift-field region 111A and the drift-field region 111B are different from each other, i.e. the lateral extent of the drift-field region 111A is larger than the lateral extent of the drift-field region 111B. In this instance, the drift-field region 111A can exhibit greater sensitivity to incident radiation than the drift-field region 111B due to the larger lateral extent of the drift-field region.

The optoelectronic module 100 can further include a spectral filter array or color filter array (CFA) such as spectral filters 113A, 113B. The spectral filters 113A, 113B are matched to the respective drift-field demodulation pixels 101A, 101B. In this example, spectral filter 113A and spectral filter 113B are transmissive to different ranges of wavelengths of electromagnetic radiation; i.e., transmitted electromagnetic radiation 114A and 114B, respectively of incident ambient electromagnetic radiation. For example, spectral filter 113A can be configured to transmit wavelengths corresponding to blue light, while spectral filter 113B can be configured to transmit wavelengths corresponding to red light. Spectral filters 113A, 113B can be configured to transmit multiple ranges of wavelengths of incident electromagnetic radiation. For example, spectral filter 113A can be configured to transmit wavelengths corresponding to blue light and wavelengths corresponding to a particular range of infrared light. Moreover, spectral filter 113B can be configured to transmit wavelengths corresponding to red light and wavelengths corresponding to a particular range of infrared light.

The transmitted electromagnetic radiation 114A, 114B can generate respective photo-generated charges 115A, 115B. Under the influence of the drift-fields in the respective drift-field regions 111A, 111B, the photo-generated charges 115A, 115B can be transported to the respective demodulation regions 108A, 108B. The photo-generated charges 115A, 115B can then be samples at the respective output nodes 109A, 109B.

As the drift-field, demodulation pixel 101A, 101B can be inherently more sensitive to some wavelengths of transmitted electromagnetic radiation as compared to other wavelengths, the distinct regions of differing potentials within the semiconductor substrate 105A, 105B of each drift-field, demodulation pixel 101A, 101B can be customized or optimized to a particular wavelength or range of wavelengths. For example, wavelengths of transmitted electromagnetic radiation corresponding to blue light can be strongly absorbed by the insulator layer 104A, 104B. In such an instance, if the spectral filter 113A is configured to transmit wavelengths corresponding to blue light, the lateral extent of the drift-field region 111A can be increased such that the sensitivity of the drift-field demodulation pixel 101A is increased. Conversely, wavelengths of incident radiation corresponding to red light can penetrate deeply into the semiconductor substrate 105A, 105B and may not be strongly absorbed by the insulator layer 104A, 104B, in some cases. Accordingly, in such an instance, if the spectral filter 113B is configured to transmit wavelength corresponding to red light, the lateral extend of the drift-field region 111B can be decreased such that the sensitivity of the drift-field demodulation pixel 101B is decreased.

Figure 1D:
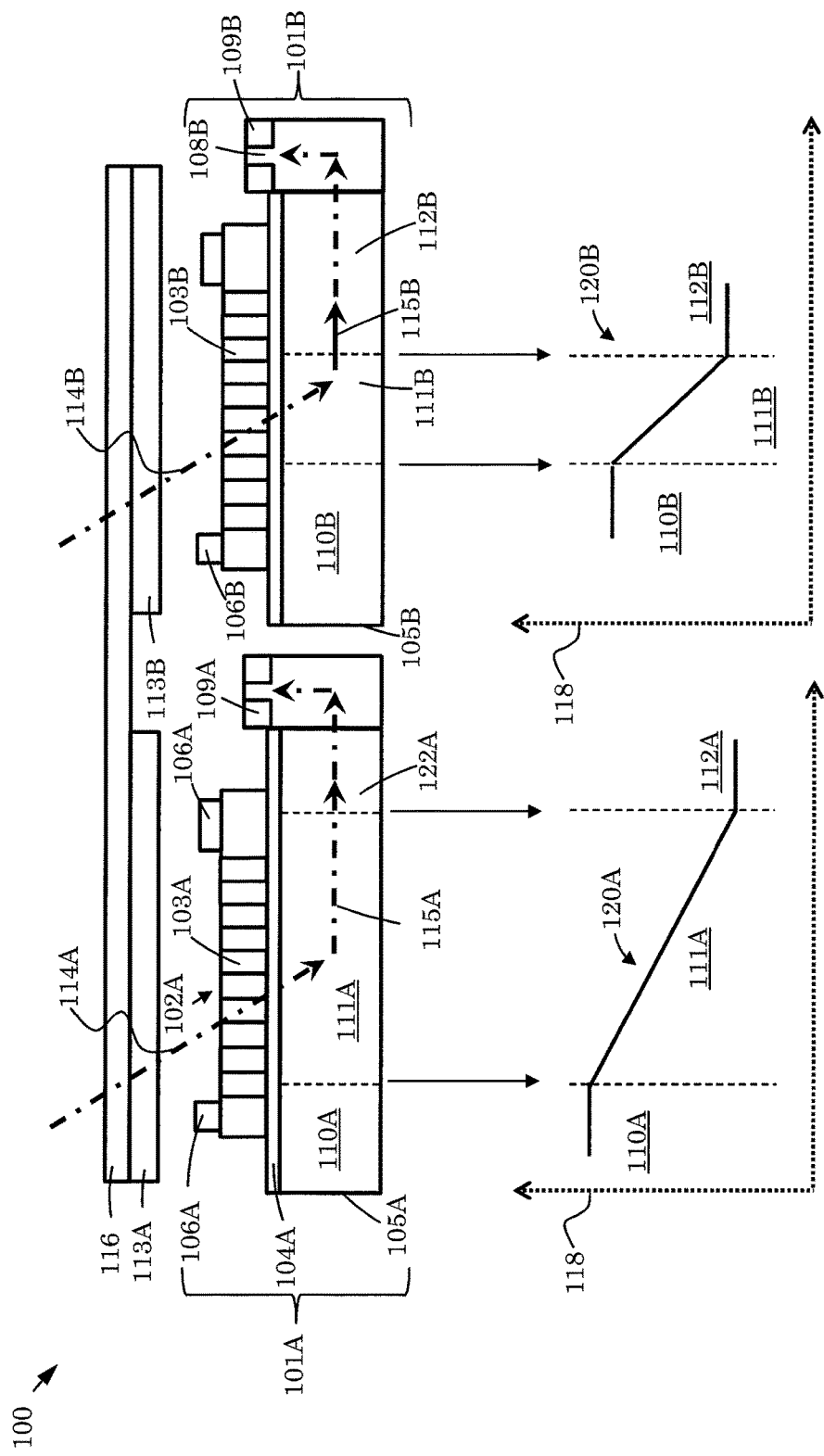
FIG. 1D depicts a side-view of the optoelectronic module depicted in FIG. 1A with an illustration of potentials that are optimized for distance data acquisition.

FIG. 1D depicts a side-view of the optoelectronic module depicted in FIG. 1A with an illustration of potentials within the semiconductor substrates 104A, 104B of each respective drift-field, demodulation pixel 101A, 101B. In this example, the potentials are optimized for distance data acquisition. As disclosed above, different potentials can be applied to each respective drift-field, demodulation pixel 101A, 101B in the drift-field, demodulation pixel array 100 via the series of contact nodes 106A, 106B and corresponding electrodes 107A, 107B, respectively. The applied potentials can generate distinct regions of differing potentials within the semiconductor substrates 105A, 105B of each respective drift-field, demodulation pixel 101A, 101B. For example, a high potential region 120A, a drift-field region 121A, and a low potential region 122A are generated in the drift-field demodulation pixel 101A depicted on the left-hand side of FIG. 1D with the application of a particular potential profile. Likewise, with the application of a different potential profile, a high potential region 120B, a drift-field region 121B, and a low potential region 122B are generated in the drift-field, demodulation pixel 101B, depicted on the right-hand side of FIG. 1D. In this example, the lateral extent of the drift-field region 121A and the drift-field region 121B are different from each other, i.e. the lateral extent of the drift-field region 121A is larger than the lateral extent of the drift-field region 121B. In this instance, the drift-field region 121A can exhibit greater sensitivity to incident radiation than the drift-field region 121B due to the larger lateral extent of the drift-field region.

In some instances, the auxiliary spectral filter 116 can transmit ranges of wavelengths corresponding to both the transmitted electromagnetic radiation 114A and the transmitted electromagnetic radiation 114B and can further transmit another wavelength or range of wavelengths. For example, auxiliary spectral filter 116 can be configured to transmit a particular range of infrared radiation, a particular range of wavelengths corresponding to red light, and a particular range of wavelengths corresponding to blue light. In particular, auxiliary spectral filter 116 can transmit a wavelength or range of wavelengths corresponding to a modulated electromagnetic radiation 117 as depicted in FIG. 1D.

The modulated electromagnetic radiation 117 can generate respective photo-generated charges 125A, 125B. Under the influence of the drift-fields in the respective drift-field regions 121A, 121B, the photo-generated charges 125A, 125B can be transported to the respective demodulation regions 108A, 108B. The photo-generated charges 125A, 125B can then be sampled at the respective output nodes 109A, 109B and correlated with a distance according to standard time-of-flight techniques.

The spectral filters 113A, 113B can transmit modulated electromagnetic radiation 117 to different degrees. Accordingly, the distinct regions of differing potentials within the semiconductor substrate 105A, 105B of each drift-field, demodulation pixel 101A, 101B can be customized or optimized for different degrees of transmitted modulated electromagnetic radiation. For example, the spectral filter 113A can transmit less modulated electromagnetic radiation 117 than the spectral filter 113B. The lateral extent of the drift-field region 121A then can be increased such that the sensitivity of the drift-field demodulation pixel 101A is increased. Further the spectral filter 113B can transmit more, even much more modulated electromagnetic radiation 117 than the spectral filter 113B. In such cases, in order to avoid saturation of the drift-field, demodulation pixel 101B, the lateral extent of the drift-field region 121B can be decreased such that the sensitivity of the drift-field demodulation pixel 101B is decreased.

According to the examples disclosed above, both distance data and spectral data can be acquired. Further, sensitivities to different wavelengths or ranges of wavelengths of incident radiation inherent within each drift-field, demodulation pixel 101A, 101B can be made invariant from pixel to pixel throughout the optoelectronic module 100 irrespective of the wavelength or range of wavelengths of transmitted electromagnetic radiation 114A, 114B; consequently, saturation of pixels 101A, 101B can be avoided or ameliorated. For instance, with respect to the above examples, incident electromagnetic radiation 119 can include wavelengths primarily corresponding to red light. A smaller fraction of incident electromagnetic radiation 119 can be ascribed to wavelengths corresponding to blue light. Consequently, in order to prevent saturation of the drift-field, demodulation pixel 101B, the drift-field potential region 111B can be modified according to the above example.

Further, the optoelectronic module, 100 can include a larger array of drift-field, demodulation pixels 101A, 101B and respective spectral filters 113A, 113B. For example, the optoelectronic module 100 can include tens, hundred, thousands, or even millions of demodulation pixels 101A, 101B and respective spectral filters 113A, 113B. Accordingly, one or more drift-field demodulation pixels 101A, 101B within the optoelectronic module 101 can be physically defective, e.g., a semiconductor substrate 105A, 105B can be marked by an impurity. A physically defective demodulation pixel can exhibit anomalous sensitivity, for example. According to the previously disclosed examples, the sensitivity of the defective pixel can be tuned/optimized such that its sensitivity can be corrected, e.g., by interpolating the sensitivities of neighboring non-defective drift-filed, demodulation pixels.

FIG. 2A depicts an example of an optoelectronic module configured to acquire both distance data and spectral data. An optoelectronic module 200A is depicted in a spectral data acquisition mode. The optoelectronic module 200A includes a demodulation pixel array 201. The demodulation pixel array 201 includes a series of demodulation pixels 203, such as drift-field demodulation pixels. The optoelectronic module 200 further includes a substrate 204, and an intensity balancing filter array 205. The intensity balancing filter array 205 includes a plurality of intensity balancing regions 206, 207, 208 with respective different transmissivities of incident, transmitted electromagnetic radiation 214. For example, intensity balancing region 206 can transmit 75% of the incident, transmitted electromagnetic radiation 214, intensity balancing region 207 can transmit 50% of the incident, transmitted electromagnetic radiation 214, and intensity balancing region 208 can transmit 25% of the incident, transmitted electromagnetic radiation 214. The transmissivity of each intensity balancing region can be wavelength dependent or need not be wavelength dependent, for example, nearly all wavelengths of visible light can be equally affected. That is, the intensity balancing regions 206, 207, 208 can be substantially transmissive to all wavelengths of light in the visible range, but be transmissive only to a respective 75%, 50%, and 25% of the total incident, transmitted electromagnetic radiation 214.

The optoelectronic module 200 further includes a color filter array (CFA) 209. The color filter array 209 includes a plurality of first spectral filter regions 210, second spectral filter regions 211, and third spectral filter regions 212. For example, the first spectral filter regions 210 can be configured to transmit wavelengths corresponding to green light, the second spectral filter regions 211 can be configured to transmit wavelengths corresponding to blue light, and the third spectral filter regions 212 can be configured to transmit wavelengths corresponding to red light. Moreover, spectral filter regions 210, 211, 212 can be configured to transmit multiple ranges of wavelengths of incident electromagnetic radiation. For example, spectral filter region 210 can be configured to transmit wavelengths corresponding to green light and wavelengths corresponding to a particular range of infrared light. Further, spectral filter regions 211 can be configured to transmit wavelengths corresponding to blue light and wavelengths corresponding to a particular range of infrared light. Still further, spectral filter regions 212 can be configured to transmit wavelengths corresponding to red light and wavelengths corresponding to a particular range of infrared light.

The first spectral filter regions 210, the second spectral filter regions 211, and the third spectral filter regions 212 can be aligned with respective first intensity balancing regions 206, second intensity balancing regions 207, and third intensity balancing regions 208 of the intensity balancing filter array 205, and each can be aligned with respective demodulation pixels 203 in the demodulation pixel array 201. The optoelectronic module 200A further includes a substrate 260 on which the pixel array 201 is mounted. Further, the spectral filter regions can be matched with respective intensity balancing regions according to the inherent sensitivity of the demodulation pixel 203. For example, if the demodulation pixel is most sensitive to red light, then blue light, then green light, the intensity balancing region with the least transmissivity (e.g. intensity balancing region 208) would be matched to the spectral filter region configured to transmit wavelengths corresponding to red light (e.g. spectral filter regions 212). Similarly, the balancing region with intermediate transmissivity (e.g. balancing region 207) would be matched to the spectral filter regions configured to transmit wavelengths corresponding to blue light (e.g. spectral filter regions 211). And, the balancing region with the greatest transmissivity (e.g. balancing region 206) would be matched to the spectral filter region configured to transmit wavelengths corresponding to green light (e.g. spectral filter region 210).

The optoelectronic module 200A further includes an auxiliary spectral filter 216. The auxiliary spectral filter 213 can transmit the same ranges of wavelengths as spectral filter regions 210, 211, and 212. In addition, the spectral filter 213 can further transmit or substantially attenuate another wavelength or range of wavelengths. For example, auxiliary spectral filter 213 can be configured to transmit a particular range of infrared radiation, a particular range of wavelengths corresponding to red light, a particular range of wavelengths corresponding to blue light, and a particular range of wavelengths corresponding to green light. In particular auxiliary spectral filter 213 can transmit a wavelength or range of wavelengths corresponding to modulated electromagnetic radiation of a particular wavelength.

The optoelectronic module 200A can be further operable to collect distance data in a distance data acquisition mode. For example, incident, transmitted electromagnetic radiation 214 can be modulated with a particular modulation frequency. Further, incident, transmitted electromagnetic radiation 214 can be a particular wavelength or range of wavelengths. When electromagnetic radiation is modulated and incident on the optoelectronic module 200A, it can transmit through the auxiliary spectral filter 213, the balancing filter array 205, and the color filter array 209. Accordingly, the electromagnetic radiation 214 can be incident on the demodulation pixel array 201 where distance can be acquired according to standard time-of-flight techniques. Further, in some cases the applied potentials of each demodulation pixel can be adjusted, optimized such that the sensitivity of each demodulation pixel complements the transmissivity of each intensity-balancing region of the intensity-balancing filter array 205 when the optoelectronic module 200A operates in a distance data acquisition mode.

FIG. 2B depicts another example of an optoelectronic module configured to acquire both distance data and spectral data via a combined intensity balancing array and color filter array. The optoelectronic module is depicted in a spectral data acquisition mode. An optoelectronic module 200B includes a demodulation pixel array 201. The demodulation pixel array 201 includes a series of demodulation pixels 203. The optoelectronic module 200B further includes a substrate 204, and a combined intensity balancing filter array and color filter array, a combined filter array 215. The combined intensity balancing filter array 215 includes a plurality of combined filter regions 216, 217, 218. The combined filter regions 216, 217, 218 combine the properties of intensity balancing regions 206, 207, 208 with the properties of the spectral filter regions 210, 211, 212 of the version/example described above (FIG. 2A). That is, combined filter regions 216, 217, 218 are characterized by respective different transmissivities of incident, transmitted electromagnetic radiation 214 and are characterized by respective different spectral filtering characteristics. For example, combined filter region 216 can transmit 75% of the total incident, transmitted electromagnetic radiation 214, and can be configured to transmit wavelengths corresponding to green light; combined filter region 217 can transmit 50% of the total incident electromagnetic radiation 214, and can be configured to transmit wavelengths corresponding to blue light; and combined filter region 218 can transmit 25% of the total incident electromagnetic radiation 214 and can be configure to transmit wavelengths corresponding to red light.

The optoelectronic module 200B can be further operable to acquire distance data in a distance data acquisition mode. As above, the electromagnetic radiation 214 incident on the optoelectronic module 201B can transmit through the auxiliary spectral filter 213, and the combined intensity balancing filter 215. Further, the incident, transmitted electromagnetic radiation 214 can be modulated with a particular modulation frequency (i.e., suitable for the acquisition of distance data via time-of-flight techniques). Accordingly, the modulated electromagnetic radiation 214 can be incident on the demodulation pixel array 203 where distance can be acquired according to standard time-of-flight techniques. Further, in some cases the applied potentials of each demodulation pixel can be adjusted, optimized (as described above) such that the sensitivity of each demodulation pixel complements the transmissivity of each intensity-balancing region of the combined filter array 215 when the optoelectronic module 200B operates in a distance data acquisition mode. In some implementations the combined filter array 215 can achieve different regions of transmissivity (e.g., in combined filters regions 216, 217, and 218) by constructing each combined filter region with a different thickness. For example, the first combined filter region 216 can be twice as thick as the second combined filter region 217, and the second combined filter region 217 can be twice as thick as the third combined filter region 218. Accordingly, the first combined filter region can be more transmissive to incident, transmitted electromagnetic radiation 214 than the second combined filter region 217, and the second combined filter region 217 can be more transmissive to incident, transmitted electromagnetic radiation 214 than the third combined filter region 218. Accordingly, each combined filter region can be customized to the intrinsic sensitivity of their respective demodulation pixel 203.

According to the examples described with respect to FIG. 2A and FIG. 2B, both spectral data and distance data can be acquired in succession (or nearly simultaneously) via the same demodulation pixel 203. The demodulation pixel's intrinsic sensitivity differences to different wavelengths or ranges of wavelengths of incident radiation can be made invariant from pixel to pixel throughout the demodulation pixel array 201 via the combination of the color filter array 209 and the intensity balancing filter array 205, or via the combined filter array 215. Consequently, saturation of pixels 203 can be avoided or mitigated.

Figure 3:
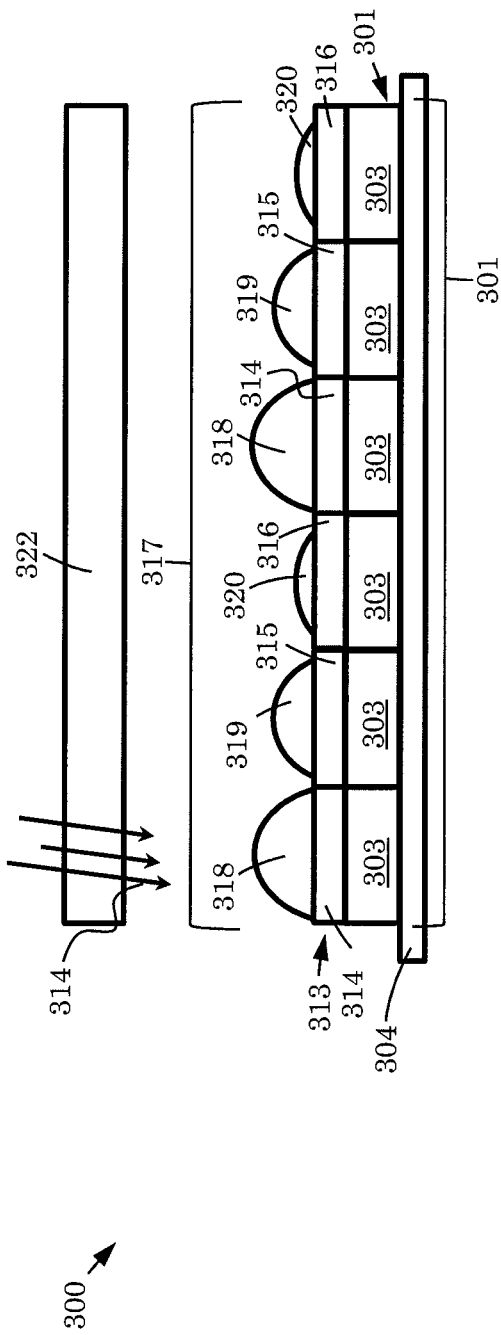
FIG. 3 depicts another example of an optoelectronic module configured to acquire both distance data and spectral data via an intensity balancing microlens array.

FIG. 3 depicts another example of an optoelectronic module configured to acquire both distance data and spectral data via an intensity balancing microlens array. The optoelectronic module is depicted in a spectral data acquisition mode. An optoelectronic module 300 includes a demodulation pixel array 301. The demodulation pixel array 301 includes a series of demodulation pixels 303. The optoelectronic module 300 further includes a substrate 304, and a spectral filter array 313. The spectral filter array 313 includes a plurality of first spectral filter regions 314, second spectral filter regions 315, and third spectral filter regions 316. For example, the first spectral filter regions 314 can be configured to transmit wavelengths corresponding to green light, the second spectral filter regions 315 can be configured to transmit wavelengths corresponding to blue light, and the third spectral filter regions 316 can be configured to transmit wavelengths corresponding to red light. Moreover, spectral filter regions 314, 315, 316 can be configured to transmit multiple ranges of wavelengths of incident electromagnetic radiation. For example, spectral filter region 314 can be configured to transmit wavelengths corresponding to green light and wavelengths corresponding to a particular range of infrared light. Further, spectral filter regions 315 can be configured to transmit wavelengths corresponding to blue light and wavelengths corresponding to a particular range of infrared light. Still further, spectral filter regions 316 can be configured to transmit wavelengths corresponding to red light and wavelengths corresponding to a particular range of infrared light. The optoelectronic module 300 further includes an intensity balancing microlens array 317. The intensity balancing microlens array further includes a plurality of intensity balancing microlenses 318, 319, 320 with respective different collecting power of incident, transmitted electromagnetic radiation 314. For example, intensity balancing microlens 318 can collect 75% of the incident electromagnetic radiation 314, intensity balancing microlens 319 can collect 50% of the incident electromagnetic radiation 314, and intensity balancing microlens 320 can collect 25% of the incident electromagnetic radiation 314.

The first spectral filter regions 314, the second spectral filter regions 315, and the third spectral filter regions 316 can be aligned with respective first intensity balancing microlenses 318, second intensity balancing microlenses 319, and third intensity balancing microlenses 320 of the intensity balancing microlens array 317, and each can be aligned with a demodulation pixel 303.

Further, the spectral filter regions can be matched with respective intensity balancing microlenses according to the inherent sensitivity of the demodulation pixel 303. For example, if the demodulation pixel is most sensitive to red light, then blue light, then green light, the intensity balancing microlenses with the least collecting power (e.g. intensity balancing microlens 320) would be matched to the spectral filter region configured to transmit wavelengths corresponding to red light (e.g. spectral filter regions 316). Similarly, the intensity balancing microlenses with intermediate collecting power (e.g. intensity balancing microlens 319) would be matched to the spectral filter regions configured to transmit wavelengths corresponding to blue light (e.g. spectral filter regions 315). And, the intensity balancing microlens with the greatest collecting power (e.g. intensity balancing microlens 318) would be matched to the spectral filter region configured to transmit wavelengths corresponding to green light (e.g. spectral filter region 314).

The optoelectronic module 300 further includes an auxiliary spectral filter 322. The auxiliary spectral filter 322 can transmit the same ranges of wavelengths as spectral filter regions 314, 315, and 316. In addition, the spectral filter 322 can further transmit another wavelength or range of wavelengths. For example, auxiliary spectral filter 322 can be configured to transmit a particular range of infrared radiation, a particular range of wavelengths corresponding to red light, a particular range of wavelengths corresponding to blue light, and a particular range of wavelengths corresponding to green light. In particular auxiliary spectral filter 322 can transmit a wavelength or range of wavelengths corresponding to incident, transmitted electromagnetic radiation 314 that is modulated with a particular modulation frequency.

The optoelectronic module 300 can further be operable to acquire distance data in a distance data acquisition mode via the intensity balancing microlens array. As above, the electromagnetic radiation 214 incident on the optoelectronic module 300 can transmit through the auxiliary spectral filter 322, the balancing microlens array 317 and the spectral filter array 313. Accordingly, the incident, transmitted electromagnetic radiation 314 modulated with a particular modulation frequency can be incident on the demodulation pixel array 301 where distance data can be acquired according to standard time-of-flight techniques.

According to the examples disclosed with respect to FIG. 3, both spectral data and distance data can be acquired in succession (or nearly simultaneously) via the same demodulation pixel. Further, sensitivity differences to different wavelengths or ranges of wavelengths of incident radiation, inherent to the demodulation pixels 303, can be made invariant from pixel to pixel throughout the demodulation pixel array 301 irrespective of the wavelength or range of wavelengths of electromagnetic radiation transmitted by the spectral filter array 313. Consequently, saturation of pixels 303 can be avoided or mitigated.

FIG. 4A depicts a plan view of an example of an optoelectronic device 400, including any of the optoelectronic modules disclosed above, operable to acquire both distance data and spectral data. FIG. 4B depicts a cross-section view of the example optoelectronic device 400 depicted in FIG. 4A. The optoelectronic device 400 includes an optoelectronic module 401, as disclosed above, an emitter 402, and a substrate 403 such as a printed circuit board substrate, silicon, or another suitable medium for mechanically and electrically mounting electronic circuitry. The optoelectronic model 401 includes a plurality of modulation pixel and a combined filter array, for example. The emitter 402 (e.g., laser diode, light-emitting diode, or an array of any of the aforementioned) can be operable to generate modulated electromagnetic radiation 404 of a particular modulation frequency and particular wavelength, wavelengths, or ranges of wavelengths. For example, the modulated electromagnetic radiation 404 can be composed of particular wavelengths that correspond to white light. In other examples, the modulated electromagnetic radiation 404 can be composed of particular wavelengths that correspond to white light and can further include infrared light. In other examples, emitter 402 can be operable to generate one particular wavelength, wavelengths, or ranges of wavelengths for one particular ambient lighting condition (e.g., natural sunlight), and can generate another particular wavelength, wavelength, or range of wavelengths for another ambient lighting condition (e.g., fluorescent lighting).

The optoelectronic device 400 further includes an optical assembly 405 mounted within a housing 406 and can include an autofocus assembly 408. The optical assembly 405 can include refractive or diffractive lenses, or spectral filters (e.g., ultraviolet, infrared, or neutral-density filters). The autofocus assembly 408 can help achieve, for example, focusing, zooming and/or image stabilization. The autofocus assembly 408 can be implemented, for example, with an electromagnetic actuator such as a voice-coil motor integrated into the housing 406. In some cases, the autofocus assembly 408 can include springs and a magnet. In some instances, the autofocus assembly 408 can include one or more electrically conductive pins, voice coils, piezoelectric components, and/or electromagnetic components. In some instances, the autofocus assembly 408 can be implemented, for example, by using a micro-electro-mechanical system (MEMS) device (e.g., a MEMS electrostatic actuator). The autofocus assembly 408 can allow the distance between the lenses in the optical assembly 405 and the optoelectronic module 401 (including the plurality of demodulation pixels) to be adjusted, for example, by as much as several tens of microns (e.g., +20 μm).

FIG. 4C depicts an example method for collecting a color image of a three-dimensional scene via the example optoelectronic device depicted in FIG. 4A and FIG. 4B. The color image can be collected using both distance data and spectral data. For example, the method can include the steps of generating 410 modulated electromagnetic radiation 404 via the emitter 402 and directing the modulated electromagnetic radiation onto the three-dimensional scene. The modulated electromagnetic radiation 404 can be white light, such as a modulated white-light flash. A modulated white-light flash can be used to collect both distance data and can further illuminate the three-dimensional scene for spectral data collection (e.g., color image capture) in a similar way as a camera camera flash. In some instance the modulated white-light flash could further include infrared light of a particular wavelength (e.g., for distance data collection), in which case the optical assembly 405 would include a bandpass filter operable to pass that particular wavelength of infrared light. The method can further include collecting 412 distance data via the plurality of demodulation pixels and the combined filter array included with the optoelectronic module 401 by focusing modulated electromagnetic radiation reflected from the three-dimensional scene onto the plurality of three-dimensional pixels and the combined filter array as disclosed above. The method can further include actuating 414 the optical assembly 405 via the autofocus assembly 408 such that the three-dimensional scene is focused on the plurality of demodulation pixels. The method can further include collecting 416 spectral data via the plurality of demodulation pixels and the combined filter array (as disclosed above), and generating a color image via the collected spectral data using, for example, using a demosaicing image reconstruction technique. The method can further include ceasing 418 generation of modulated electromagnetic radiation from the emitter.

Figure 4D:
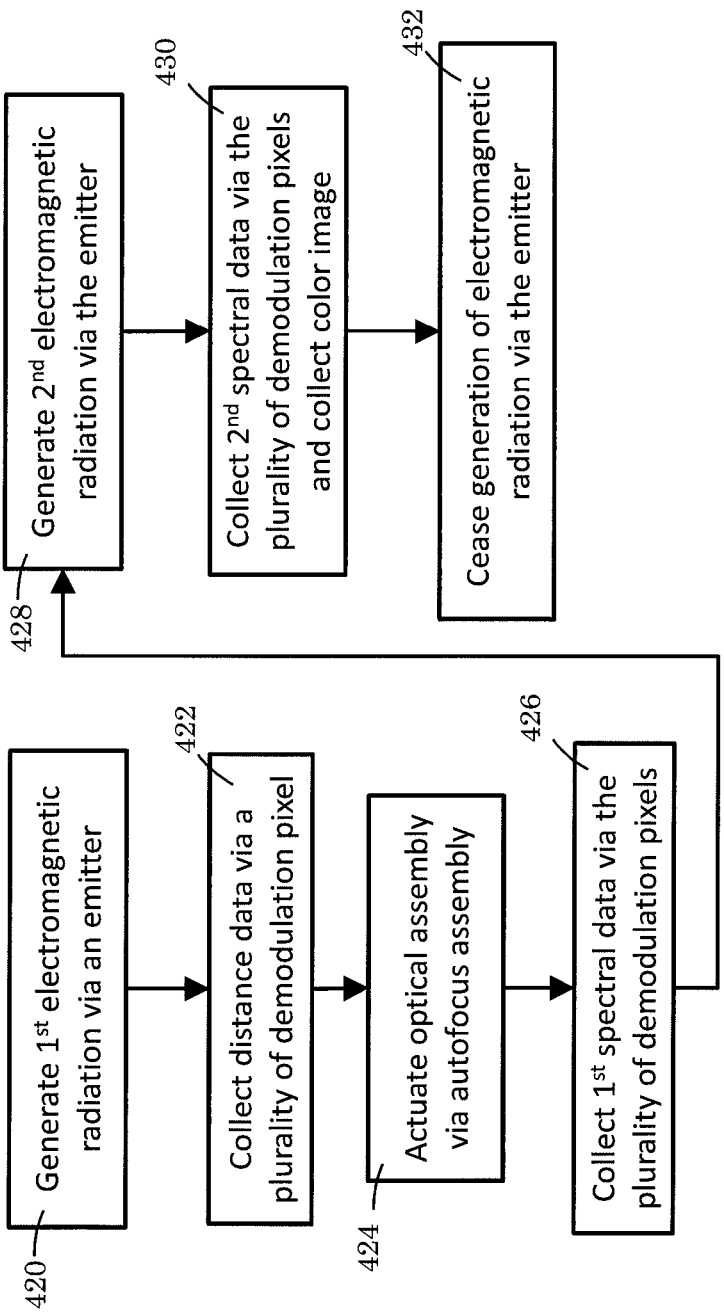
FIG. 4D depicts another example method for collecting a color image via the example optoelectronic device depicted in FIG. 4A and FIG. 4B.

FIG. 4D depicts another example method for collecting a color image of a three-dimensional scene via the example optoelectronic device depicted in FIG. 4A and FIG. 4B. The color image can be collected using both distance data and spectral data. For example, the method can include the steps of generating 420 modulated electromagnetic radiation 404 via the emitter 402 and directing the modulated electromagnetic radiation onto the three-dimensional scene. In some instances, the emitter 402 can be operable to generate a first particular wavelength, wavelengths, or ranges of wavelengths for a particular ambient lighting condition (e.g., natural sunlight) as a default wavelength, wavelengths, or ranges of wavelengths. The method can further include collecting 422 distance data via the plurality of demodulation pixels and the combined filter array included with the optoelectronic module 401 by focusing the first particular wavelength, wavelengths, or ranges of wavelengths of modulated electromagnetic radiation reflected from the three-dimensional scene onto the plurality of three-dimensional pixels and the combined filter array as disclosed above. The method can further include actuating 424 the optical assembly 405 via the autofocus assembly 408 such that the three-dimensional scene is focused on the plurality of demodulation pixels. The method can further include collecting 426 first spectral data via the plurality of demodulation pixels and the combined filter array (as disclosed above), and determining whether a second particular wavelength, wavelengths, or ranges of wavelengths of modulated radiation should be generated by the emitter 402 and directed to the three-dimensional scene (e.g., to improve the first spectral data collected in the collecting step 426). For example, in some instances first spectral data may be collected in an artificial lighting environment (e.g., florescent lighting) wherein the first spectral data collected with the first particular wavelength, wavelengths, or ranges of wavelengths of modulated electromagnetic radiation does not provide optimal (e.g., aesthetically pleasing) lighting conditions for the acquisition of spectral data; for example, first spectral data (if used to generate a color image) may have a cold color temperature. Accordingly, the method can further include generating 428 modulated electromagnetic radiation 404 via the emitter 402 and directing the modulated electromagnetic radiation onto the three-dimensional scene wherein the emitter 402 can be operable to generate a second particular wavelength, wavelengths, or ranges of wavelengths that are more appropriate for the particular ambient lighting condition. The method can further include collecting 430 second spectral data via the plurality of demodulation pixels and the combined filter array (as disclosed above). The latter step further can include generating a color image via the collected second spectral data using, for example, a de-mosaicing image reconstruction technique. The method can further include ceasing 432 generation of modulated electromagnetic radiation from the emitter.

Various modifications can be made within the spirit of this disclosure, and features from different implementations may be combined in a single implementation in some cases. Accordingly, other implementations are within the scope of the claims.

What is claimed is:

1. An optoelectronic module operable to collect distance data and spectral data via the same demodulation pixel array, the optoelectronic module comprising:
   a plurality of demodulation pixels, and a plurality of respective spectral filters each disposed to respectively transmit a particular wavelength or range of wavelengths of electromagnetic radiation to a respective demodulation pixel among the plurality of demodulation pixels;
   an emitter operable to generate modulated electromagnetic radiation having a particular modulation frequency and a particular emission wavelength or range of emission wavelengths; and
   an optical assembly including a plurality of optical elements mounted within an optical element housing, the optical assembly having a focal-length wherein the optical assembly is aligned with the plurality of demodulation pixels and separated from the plurality of demodulation pixels by the focal-length, wherein the demodulation pixels among the plurality of demodulation pixels are operable to modify their respective sensitivities to electromagnetic radiation according to the particular wavelength or range of wavelengths of electromagnetic radiation transmitted by their respective spectral filters.

2. The optoelectronic module of claim 1 further comprising an auxiliary spectral filter, the auxiliary spectral filter being disposed to transmit the particular emission wavelength or range of emission wavelengths of electromagnetic radiation generated by the emitter.

3. The optoelectronic module of claim 2, wherein the particular emission wavelength or range of emission wavelengths of electromagnetic radiation generated by the emitter correspond to the infrared region of the electromagnetic spectrum.

4. The optoelectronic module of claim 1, wherein the demodulation pixels among the plurality of demodulation pixels are further operable to modify their respective sensitivities to electromagnetic radiation according to the particular wavelength or range of wavelengths of electromagnetic radiation transmitted by their respective spectral filters such that an intensity of a signal generated in a respective demodulation pixel within the demodulation pixel array is not saturated.

5. The optoelectronic module of claim 1, wherein the demodulation pixels within the array of demodulation pixels are drift-field demodulation pixels, the drift-field demodulation pixels being operable to modify their respective sensitive to electromagnetic radiation by modification of respective drift-fields within each respective drift-field demodulation pixel.

6. The optoelectronic module of claim 5, wherein the plurality of respective spectral filters comprises a first spectral filter, a second spectral filter, and a third spectral filter, and wherein the first spectral filter corresponds to a red filter, the second spectral filter corresponds to a green filter, and the third spectral filter corresponds to a blue filter.

7. The optoelectronic module of claim 6, wherein the drift-field demodulation pixels within the array of drift-field demodulation pixels associated with the first filter are operable to have a first sensitivity, the drift-field demodulation pixels within the array of drift-field demodulation pixels associated with the second filter are operable to have a second sensitivity, and the drift-field demodulation pixels within the array of drift-field demodulation pixels associated with the third filter are operable to have a third sensitivity.

8. The optoelectronic module of claim 7, wherein the third sensitivity is greater than the second sensitivity, and the second sensitivity is greater than the first sensitivity.

9. An optoelectronic module as in claim 1, in which the optoelectronic module further comprises an intensity balancing filter array, the intensity balancing filter array including a plurality of intensity balancing regions with respective different wavelength-independent transmissivities to electromagnetic radiation, each respective intensity balancing region being associated with a respective spectral filter.

10. An optoelectronic module as in claim 1, in which the optoelectronic module further comprises an intensity balancing microlens array, the intensity balancing microlens array including a plurality of intensity balancing microlenses with respective different wavelength-independent transmissivities to electromagnetic radiation, each respective intensity balancing region being associated with a respective spectral filter.

11. An optoelectronic device operable to collect distance data and spectral data via the same demodulation pixel array, the optoelectronic module comprising:

a plurality of demodulation pixels and a combined filter array;

an emitter operable to generate modulated electromagnetic radiation having a particular modulation frequency and a particular emission wavelength or range of emission wavelengths; and an optical assembly including a plurality of optical elements mounted within an optical element housing, the optical assembly having a focal-length wherein the optical assembly is aligned with the plurality of demodulation pixels and separated from the plurality of demodulation pixels by the focal-length.

12. The optoelectronic device of claim 11, wherein the optoelectronic device further comprises an autofocus assembly.

13. The optoelectronic device of claim 12, wherein the emitter is operable to generate a plurality of wavelengths of demodulated electromagnetic radiation.

14. The optoelectronic device of claim 13, wherein the plurality of wavelengths of demodulated electromagnetic radiation corresponds to white light.

15. The optoelectronic device of claim 13, wherein the plurality of wavelengths of demodulated electromagnetic radiation corresponds to white light and further includes infrared.

16. A method for collecting a color image of a three-dimensional scene with an optoelectronic device operable to collect distance data and spectral data via the same demodulation pixel array, the method comprising:

generating modulated electromagnetic radiation via an emitter and directing the modulated electromagnetic radiation onto the three-dimensional scene;

focusing modulated electromagnetic radiation reflected from the three-dimensional scene onto a plurality of three-dimensional pixels and a combined filter array;

collecting distance data via the plurality of demodulation pixels and the combined filter array;

actuating an optical assembly via an autofocus assembly based on the distance data collected via the plurality of demodulation pixels and the combined filter array such that the three-dimensional scene is focused on the plurality of demodulation pixels;

collecting spectral data via the plurality of demodulation pixels and the combined filter array, and generating a color image via the collected spectral data; and ceasing generation of modulated electromagnetic radiation from the emitter.

17. The method of claim 16 wherein the modulated electromagnetic radiation generated from the emitter corresponds to white light.

18. A method for collecting a color image of a three-dimensional scene with an optoelectronic device operable to collect distance data and spectral data via the same demodulation pixel array, the method comprising:

generating first modulated electromagnetic radiation via an emitter and directing the first modulated electromagnetic radiation onto the three-dimensional scene;

focusing first modulated electromagnetic radiation reflected from the three-dimensional scene onto a plurality of three-dimensional pixels and a combined filter array;

collecting distance data via the plurality of demodulation pixels and the combined filter array;

actuating an optical assembly via an autofocus assembly based on the distance data collected via the plurality of demodulation pixels and the combined filter array such that the three-dimensional scene is focused on the plurality of demodulation pixels;

collecting first spectral data via the plurality of demodulation pixels and the combined filter array;

generating second modulated electromagnetic radiation via the emitter, the second modulated electromagnetic radiation being adjusted based on the first spectral data, directing the second modulated electromagnetic radiation onto the three-dimensional scene;

focusing second modulated electromagnetic radiation reflected from the three-dimensional scene onto the plurality of three-dimensional pixels and the combined filter array;

collecting second spectral data via the plurality of demodulation pixels and the combined filter array, and generating a color image via the collected second spectral data; and ceasing generation of second modulated electromagnetic radiation from the emitter.

\* \* \* \* \*